United States Patent
Yoo et al.

(10) Patent No.: US 10,276,400 B2
(45) Date of Patent: Apr. 30, 2019

(54) METHOD FOR FABRICATING ARRAY SUBSTRATE, ARRAY SUBSTRATE AND DISPLAY DEVICE

(71) Applicant: Boe Technology Group Co., Ltd., Beijing (CN)

(72) Inventors: Seongyeol Yoo, Beijing (CN); Seungjin Choi, Beijing (CN); Youngsuk Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/022,283

(22) PCT Filed: Sep. 18, 2015

(86) PCT No.: PCT/CN2015/089965
§ 371 (c)(1),
(2) Date: Mar. 16, 2016

(87) PCT Pub. No.: WO2016/169202
PCT Pub. Date: Oct. 27, 2016

(65) Prior Publication Data
US 2017/0062238 A1  Mar. 2, 2017

(30) Foreign Application Priority Data

Apr. 24, 2015  (CN) .......................... 2015 1 0199009

(51) Int. Cl.
*H01L 21/44* (2006.01)
*H01L 27/12* (2006.01)
(Continued)

(52) U.S. Cl.
CPC .......... *H01L 21/44* (2013.01); *H01L 27/1225* (2013.01); *H01L 29/45* (2013.01);
(Continued)

(58) Field of Classification Search
CPC ............. H01L 29/66765; H01L 29/458; H01L 29/66757; H01L 27/1104; H01L 27/0203; H01L 27/088; H01L 21/44
See application file for complete search history.

(56) References Cited

U.S. PATENT DOCUMENTS 5,976,902 A * 11/1999 Shih .................. H01L 29/66757
257/59
2001/0019125 A1  9/2001 Hong et al.
(Continued)

FOREIGN PATENT DOCUMENTS

CN  101494201  7/2009
CN  102456743  5/2012
(Continued)

OTHER PUBLICATIONS

International Search Report and Written Opinion from PCT/CN15/89965 dated Jan. 7, 2016.
(Continued)

*Primary Examiner* — Zandra V Smith
*Assistant Examiner* — John M Parker
(74) *Attorney, Agent, or Firm* — Calfee, Halter & Griswold LLP

(57) ABSTRACT

The invention relates to a method for fabricating an array substrate, an array substrate and a display device. The method for fabricating an array substrate may comprise: forming a pattern including a source electrode, a drain electrode and a data line; forming a non-crystalline semiconductor thin film layer; and performing annealing, so as to convert only the non-crystalline semiconductor thin film layer on the source electrode, drain electrode and data line to a metal semiconductor compound. By converting only the non-crystalline semiconductor thin film layer on the source electrode, drain electrode and data line into a metal semiconductor compound, the resulting metal semiconductor
(Continued)

compound may prevent oxidative-corrosion of the metal thin film layer, such as a low-resistance metal (e.g., Cu or Ti) layer, in the subsequent procedures, which is favorable for the fabrication of a metal oxide thin film transistor using Cu or Ti.

14 Claims, 2 Drawing Sheets

(51) Int. Cl.
    *H01L 29/45* (2006.01)
    *H01L 29/66* (2006.01)
    *H01L 29/786* (2006.01)

(52) U.S. Cl.
    CPC ...... *H01L 29/458* (2013.01); *H01L 29/66969* (2013.01); *H01L 29/7869* (2013.01); *H01L 29/78681* (2013.01); *H01L 29/78696* (2013.01)

(56) References Cited

U.S. PATENT DOCUMENTS

| | | | | |
|---|---|---|---|---|
| 2002/0001892 A1* | 1/2002 | Kim | ............... | H01L 21/28079 438/197 |
| 2006/0118793 A1* | 6/2006 | Yang | ............... | H01L 29/458 257/79 |
| 2006/0205125 A1* | 9/2006 | Bae | ............... | H01L 29/458 438/149 |
| 2009/0098673 A1* | 4/2009 | Yang | ............... | H01L 29/458 438/29 |
| 2011/0108830 A1* | 5/2011 | Park | ............... | H01L 29/7869 257/43 |
| 2014/0094023 A1 | 4/2014 | Lee et al. | | |

FOREIGN PATENT DOCUMENTS

| | | |
|---|---|---|
| CN | 104241112 | 12/2014 |
| CN | 104241112 A | 12/2014 |
| CN | 104779202 | 7/2015 |
| CN | 104867941 | 8/2015 |
| KR | 100192371 B1 | 6/1999 |

OTHER PUBLICATIONS

First Office Action for Chinese Patent Application No. 201510199009.4 dated Apr. 20, 2017.
Second Office Action for Chinese Patent Application No. 201510199009.4 dated Dec. 20, 2017.
Third Office Action for Chinese Patent Application No. 201510199009.4 dated May 22, 2018.

\* cited by examiner

METHOD FOR FABRICATING ARRAY SUBSTRATE, ARRAY SUBSTRATE AND DISPLAY DEVICE

RELATED APPLICATIONS

The present application is the U.S. national phase entry of PCT/CN2015/089965, with an international filling date of Sep. 18, 2015, which claims the benefit of Chinese Patent Application NO. 201510199009.4, filed on Apr. 24, 2015, the entire disclosure of which are incorporated herein by reference.

FIELD OF THE INVENTION

The invention relates to the field of display, in particular, to a method for fabricating an array substrate, an array substrate fabricated using such method, and a display device comprising the array substrate.

BACKGROUND OF THE INVENTION

During an existing process for fabricating thin film transistors for display devices, electrodes (e.g., a gate, a source electrode and a drain electrode) or electrode leads (e.g., gate lines and data lines) usually require the application of low-resistance metals (e.g., Cu, etc.). However, in the circumstances where such metals are used, there is a problem that the metals are restricted in many procedures due to the corrosion of metal surfaces caused by oxidation. In other words, as the metal surfaces have the phenomenon of corrosion caused by oxidation, usage of such metals is restricted in many procedures.

Accordingly, there is an urgent need in the prior art to develop a new technique to prevent the corrosion of metal electrode surfaces caused by oxidation during the processes for fabricating the display devices comprising thin film transistors.

SUMMARY OF THE INVENTION

In view of this, embodiments of the invention provide a method for fabricating an array substrate by using such method, and a display device comprising the array substrate, which can overcome or at least alleviate some of the deficiencies existing in the prior art.

In one aspect, a method for fabricating an array substrate is provided. The method may comprise the following steps: forming a pattern including a source electrode, a drain electrode and a data line; forming a non-crystalline semiconductor thin film layer; performing annealing, so as to convert only the non-crystalline semiconductor thin film layer on the source electrode, drain electrode and data line to a metal semiconductor compound.

With the method for fabricating an array substrate provided by an embodiment of the invention, by converting only the non-crystalline semiconductor thin film layer on the source electrode, drain electrode and data line into a metal semiconductor compound, the resulting metal semiconductor compound may prevent the oxidative-corrosion of the surface of the metal thin film layer, such as a low-resistance metal Cu layer, in the subsequent procedures. By means of such method, metal oxide thin film transistors such as indium gallium zinc oxide InGaZnO (IGZO) thin film transistor, indium tin zinc oxide InSnZnO (ITZO) thin film transistor and nitrogen-doped zinc oxide ZnON thin film transistor may be fabricated, and also the oxidation of low-resistance metal such as Cu at the source electrode or drain electrode can be prevented during the fabrication procedure of the thin film transistor using low-resistance metals such as Cu.

In an embodiment of the invention, the method for fabricating an array substrate may also include the following step: prior to forming the pattern including the source electrode, drain electrode and data line, forming on the substrate a gate, a gate line, a gate insulation layer covering the gate and the gate line, and an active layer arranged on the gate insulation layer and corresponding to the gate.

In another embodiment of the invention, the step of forming a pattern including a source electrode, a drain electrode and a data line may comprise: forming a metal thin film layer; and removing the metal thin film layer outside regions of the source electrode, drain electrode and data line through a patterning process.

In another embodiment of the invention, the method for fabricating an array substrate may also include a step of removing the non-crystalline semiconductor thin film layer outside the regions of the source electrode, drain electrode and data line.

For the embodiment of the invention, after the metal thin film layer is formed, the metal thin film layer outside the regions of the source electrode, drain electrode and data line can be removed through a patterning process, i.e., the metal thin film layer not used as the source electrode, drain electrode and data line above the substrate surface is selectively removed, and only the metal thin film layer serving as the source electrode, drain electrode and data line is remained. Subsequently, a non-crystalline semiconductor thin film layer is formed, and the non-crystalline semiconductor thin film layer may cover the metal thin film layer at the position of the source electrode, drain electrode and data line and the upper surfaces of other regions of the substrate not occupied by the metal thin film layer serving as the source electrode, drain electrode and data line. In this embodiment, such manner is only for convenience of the formation of the non-crystalline semiconductor thin film layer. In other embodiments, the non-crystalline semiconductor thin film layer can be also directly formed only on the metal thin film layer at the position of the source electrode, drain electrode and data line. The subsequent annealing step only converts the non-crystalline semiconductor thin film layer on the source electrode, drain electrode and data line into a metal semiconductor compound, since the non-crystalline semiconductor thin film layer covering the metal thin film layer for the source electrode, drain electrode and data line would react with the metal thin film layer below, thus forming a metal semiconductor compound layer. Since there is no metal thin film layer at positions other than the source electrode, drain electrode and data line, situation of converting the non-crystalline semiconductor thin film layer to a metal semiconductor compound layer will not occur. For example, the non-crystalline semiconductor thin film layer at regions does not react with the gate insulation layer (e.g., $SiO_2$) and active layer (e.g., IGZO, ITZO or ZnON, etc.) during the annealing process.

In another embodiment of the invention, the method for fabricating an array substrate may also include the following steps: forming a passivation layer, and etching portions of the passivation layer corresponding to the drain electrode, gate line and data line to form corresponding through-holes.

In another embodiment of the invention, the method for fabricating an array substrate may also include the following step: forming a via-hole of the gate insulation layer at a position corresponding to the gate line on the gate insulation layer.

In an embodiment of the invention, the method for fabricating an array substrate may also include the following steps: forming a transparent conductive thin film and forming a pattern including a pixel electrode, a connection line for the gate line and a connection line for the data line on the passivation layer with the through-holes through a patterning process, wherein a metal semiconductor compound on the drain electrode is electrically connected to the pixel electrode by means of the through-hole corresponding to the drain electrode.

In another embodiment of the invention, the metal thin film layer may comprise a layer of copper or titanium.

In another embodiment of the invention, the non-crystalline semiconductor thin film layer may comprise a layer of α-silicon, α-germanium, α-gallium arsenide, α-arsenic sulfide or α-selenium.

In another embodiment of the invention, the metal semiconductor compound may comprise a silicide of copper, a germanide of copper, a compound of copper and α-gallium arsenide, a compound of copper and α-arsenic sulfide, a compound of copper and α-selenium, a silicide of titanium, a germanide of titanium, a compound of titanium and α-gallium arsenide, a compound of titanium and α-arsenic sulfide, or a compound of titanium and α-selenium.

In another embodiment of the invention, the thickness of the non-crystalline semiconductor thin film layer may be 10 Å-50 Å.

In an embodiment of the invention, a temperature for the annealing may range between 200° C. and 280° C.

In another embodiment of the invention, the annealing may be performed under nitrogen atmosphere.

In another embodiment of the invention, the active layer may be a metal oxide layer.

In another embodiment of the invention, the metal oxide layer may comprise an indium gallium zinc oxide (InGaZnO), indium tin zinc oxide (InSnZnO) or nitrogen-doped zinc oxide (ZnON) semiconductor layer.

According to a second aspect of the invention, an array substrate fabricated by using the above mentioned method for fabricating an array substrate is provided.

For the array substrate fabricated by using the above mentioned method for fabricating an array substrate, by converting only the non-crystalline semiconductor thin film layer on the source electrode, drain electrode and data line into a metal semiconductor compound, the resulting metal semiconductor compound may prevent oxidative-corrosion of the metal thin film layer, such as a low-resistance metal (e.g., Cu) layer, in the subsequent procedures. By means of such method provided by the embodiment of the invention, metal oxide thin film transistors such as indium gallium zinc oxide InGaZnO (IGZO) thin film transistor, indium tin zinc oxide InSnZnO (ITZO) thin film transistor and nitrogen-doped zinc oxide ZnON thin film transistor may be fabricated, and also the oxidation of low-resistance metal such as Cu at the source electrode or drain electrode can be prevented during the fabrication procedure of the thin film transistor using low-resistance metals such as Cu.

According to a third aspect of the invention, a display device comprising the abovementioned array substrate is provided.

The following reference signs will be used throughout the drawings:

12: a substrate; 14: a gate; 16: a gate line; 18: a gate insulation layer;
20: an active layer; 22a: a source electrode; 22b: a drain electrode;
22c: a data line; 24: a non-crystalline semiconductor thin film layer;
26a: a source metal semiconductor compound layer;
26b: a drain metal semiconductor compound layer;
26c: a metal semiconductor compound layer for the data line;
30: a passivation layer;
32a: a through-hole corresponding to the drain electrode;
32b: a through-hole corresponding to the gate line;
32c: a through-hole corresponding to the data line;
34: a pixel electrode; 36: a connection line for the gate line;
38: a connection line for the data line.

DETAILED DESCRIPTION OF THE INVENTION

Embodiments of the invention will be described in detail below with reference to FIGS. 1-8 of the application.

The term "forming" mentioned herein shall be understood in a broad sense. For example, it can be performed by means of processes commonly used in the art, such as chemical vapor deposition and molecular beam epitaxy, and so on. Since there are many ways for forming thin films and there are relatively more suitable formation processes for different materials, technical processes for forming each thin film will not be specifically indicated herein, as these processes are not the key points of the invention.

FIGS. 1-8 illustratively show the steps of the method for fabricating an array substrate according to an embodiment of the invention. Firstly, forming a gate 14 and a gate line 16 on a substrate 12 such as a silicon substrate. The gate line 16 may be used to connect the gates 14 of various transistors in the subsequent procedures. That is to say, prior to forming a metal thin film layer for a source electrode, a drain electrode and a data line, the gate 14 and the gate line 16 are formed on the substrate 12. As for the metal thin film layer for the source electrode, the drain electrode and the data line, it will be further expounded hereinafter.

Figure 1:
FIG. 1 illustrates a step of the method for fabricating an array substrate according to an embodiment of the invention.
Figure 2:
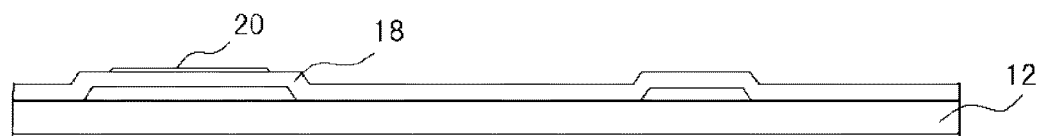
FIG. 2 illustrates a step of the method for fabricating an array substrate according to an embodiment of the invention.

Next, as shown in FIG. 2, a gate insulation layer 18 may be formed on the gate 14, the gate line 16 and remaining portions of the substrate 12 not covered by the gate 14 and the gate line 16, i.e., the gate insulation layer 18 at least covering the gate 14 and gate line 16 is formed. An active layer 20 may be formed on the gate insulation layer 18, which is also above the region of the gate 14, i.e., the active layer 20 arranged on the gate insulation layer 18 and corresponding to the region of gate 14 may be formed. The active layer 20 may be a metal oxide layer, for example, indium gallium zinc oxide InGaZnO (IGZO), indium tin zinc oxide InSnZnO (ITZO), nitrogen-doped zinc oxide ZnON, or a semiconductor layer such as non-crystalline silicon (α-silicon).

Figure 3:
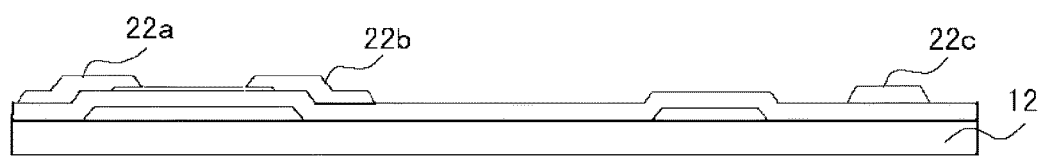
FIG. 3 illustrates a step of the method for fabricating an array substrate according to an embodiment of the invention.

Subsequently, a pattern including a source electrode, a drain electrode and a data line may be formed. As shown in FIG. 3, a source electrode 22a, a drain electrode 22b and a data line 22c may be formed at corresponding positions of the gate insulation layer 18 and the active layer 20. The steps of forming a pattern including a source electrode, a drain electrode and a data line may comprise forming a metal thin film layer. The complete metal thin film layer is not shown in FIG. 3. For convenience of fabrication, the metal thin film layer may cover the entire region of the active layer 20 and the (exposed) upper surface of the gate insulation layer 18 not occupied by the active layer 20. Then, the metal thin film layer outside regions of the source electrode, drain electrode and data line may be removed by a patterning process. In FIG. 3, the metal thin film layer outside regions of the source electrode, drain electrode and data line has been removed by a patterning process, and only portions of the metal thin film layer for the source electrode 22a, the drain electrode 22b and the data line 22c are remained. The metal thin film layer may be a copper or titanium layer. Alternatively, the metal thin film layer for the source electrode 22a, drain electrode 22b and data line 22c can be also directly formed, and the patterning process could be omitted in this way.

Figure 4:
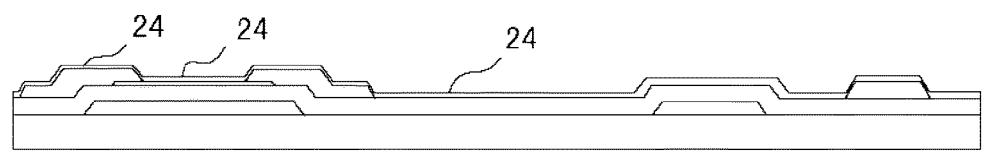
FIG. 4 illustrates a step of the method for fabricating an array substrate according to an embodiment of the invention.

Subsequently, a non-crystalline semiconductor thin film layer 24 may be formed, as shown in FIG. 4. For convenience of fabrication, the non-crystalline semiconductor thin film layer 24 may be formed on the metal thin film layer for the source electrode 22a, drain electrode 22b and data line 22c, the exposed upper surface of the gate insulation layer 18 and the upper surface of the active layer 20. In this embodiment, this is only for convenience of the formation of the non-crystalline semiconductor thin film layer 24. Alternatively, non-crystalline semiconductor thin film layers 24 can be also directly formed only on the metal thin film layer for the source electrode 22a, drain electrode 22b and data line 22c. The non-crystalline semiconductor thin film layer 24 may be a layer of α-silicon, α-germanium, α-gallium arsenide, α-arsenic sulfide or α-selenium. In an embodiment, the thickness of the non-crystalline semiconductor thin film layer 24 may be 10 Å-50 Å.

Figure 5:
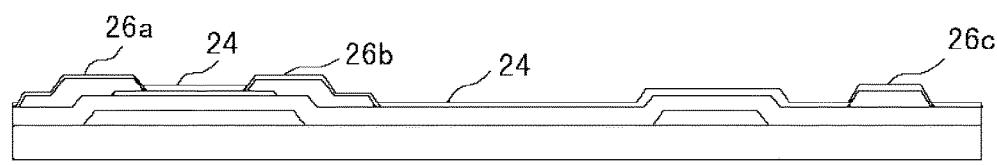
FIG. 5 illustrates a step of the method for fabricating an array substrate according to an embodiment of the invention.

Then, an annealing process may be performed, so as to only convert the non-crystalline semiconductor thin film layer 24 on the source electrode, drain electrode and data line to a metal semiconductor compound, as shown in FIG. 5, for example, a source metal semiconductor compound layer 26a, a drain metal semiconductor compound layer 26b and a metal semiconductor compound layer 26c for the data line shown in FIG. 5. Only the non-crystalline semiconductor thin film layers 24 on the source electrode, drain electrode and data line are converted into a metal semiconductor compound, while non-crystalline semiconductor thin film layers 24 at other positions are not converted into the metal semiconductor compound. This is because the non-crystalline semiconductor thin film layer 24 such as α-silicon may react with the metal thin film layer for the source electrode 22a, drain electrode 22b and data line 22c below to form corresponding metal semiconductor compound, whereas the non-crystalline semiconductor thin film layer 24 such as α-silicon at other positions does not react with the gate insulation layer 18 or active layer 20 below. In this embodiment, the gate insulation layer 18 may be made of a low-permittivity non-crystalline fluorinated resin or a high-permittivity metal oxide (e.g., $SiO_2$) or the like. These materials of the gate insulation layer 18 would not react with the non-crystalline semiconductor thin film layer 24 such as α-silicon above during the annealing process. Likewise, the active layer (e.g., IGZO, ITZO or ZnON, etc.) would not react with the non-crystalline semiconductor thin film layer 24 above such as α-silicon, either. On the contrary, the non-crystalline semiconductor thin film layer 24 of α-silicon would react with the metal thin film layer for the source electrode 22a, drain electrode 22b and data line 22c below. During the annealing process, Cu atoms in the metal thin film layer (e.g., a Cu layer) for the source electrode 22a, drain electrode 22b and data line 22c would diffuse into the non-crystalline semiconductor thin film layer 24 (e.g., an α-silicon layer), such that Cu atoms and Si atoms bind together to form a silicide of copper, such as $Cu_5Si$. There is a strong binding force between Cu and Si. The adhesion of $Cu_5Si$ is very strong such that the binding between Cu and oxygen can be prevented. Accordingly, the problem of oxidative-corrosion for Cu may be mitigated or avoided. The annealing process may be performed under nitrogen atmosphere, so as to form a thicker silicide of copper, for example, $Cu_5Si$. In an embodiment, annealing may be performed at a temperature ranging about between 200° C. and 280° C.

According to an embodiment of the invention, metal semiconductor compounds, for example, the source metal semiconductor compound layer 26a, the drain metal semiconductor compound layer 26b and the metal semiconductor compound layer 26c for the data line may include a silicide of copper, a germanide of copper, a compound of copper and α-gallium arsenide, a compound of copper and α-arsenic sulfide, a compound of copper and α-selenium, a silicide of titanium, a germanide of titanium, a compound of titanium and α-gallium arsenide, a compound of titanium and α-arsenic sulfide, or a compound of titanium and α-selenium. It is known to a person skilled in the art that the term "α" denotes an amorphous state.

The metal thin film layer for the source electrode 22a, drain electrode 22b and data line 22c may also be a titanium (Ti) layer. In this case, during the annealing process, Ti atoms in the Ti layer would diffuse into the non-crystalline semiconductor thin film layer 24 such as an α-silicon layer, such that Ti atoms and Si atoms bind together to form a silicide of titanium, for example, titanium silicide $TiSi_2$. Likewise, there is a strong binding force between Ti and Si. The adhesion of $TiSi_2$ is very strong such that the binding between Ti and oxygen can be prevented, thereby the problem of corrosion for Ti caused by oxidation can be overcomed. In an embodiment, the annealing process may be performed under nitrogen atmosphere, so as to form a thicker silicide of titanium, for example, $TiSi_2$.

Since the metal thin film layer for the source electrode 22a, drain electrode 22b and data line 22c may be a layer of copper or titanium, the non-crystalline semiconductor thin film layer 24 may be a layer of α-silicon, α-germanium, α-gallium arsenide, α-arsenic sulfide or α-selenium, accordingly, the source metal semiconductor compound layer 26a, the drain metal semiconductor compound layer 26b and the metal semiconductor compound layer 26c for the data line formed after annealing may be a silicide of copper, a germanide of copper, a compound of copper and α-gallium arsenide, a compound of copper and α-arsenic sulfide, a compound of copper and α-selenium, a silicide of titanium, a germanide of titanium, a compound of titanium and α-gallium arsenide, a compound of titanium and α-arsenic sulfide, or a compound of titanium and α-selenium. As mentioned above, this is not difficult for a person having ordinary skill in the art to understand.

Figure 6:
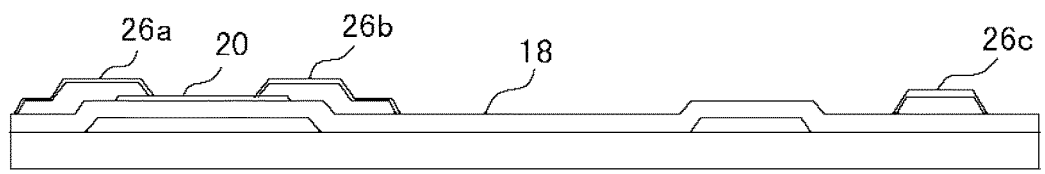
FIG. 6 illustrates a step of the method for fabricating an array substrate according to an embodiment of the invention.

Then, the non-crystalline semiconductor thin film layer 24 outside the source electrode, drain electrode and data line may be removed, as shown in FIG. 6. In FIG. 6, after the non-crystalline semiconductor thin film layer 24 outside the source electrode, drain electrode and data line is removed, at least a portion of the active layer 20 and gate insulation layer 18 are exposed.

Figure 7:
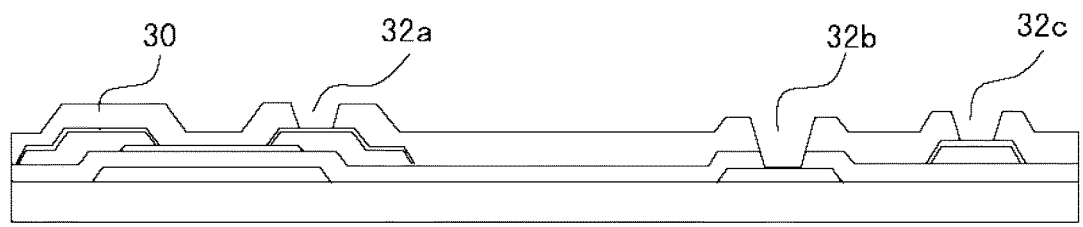
FIG. 7 illustrates a step of the method for fabricating an array substrate according to an embodiment of the invention.
Figure 8:
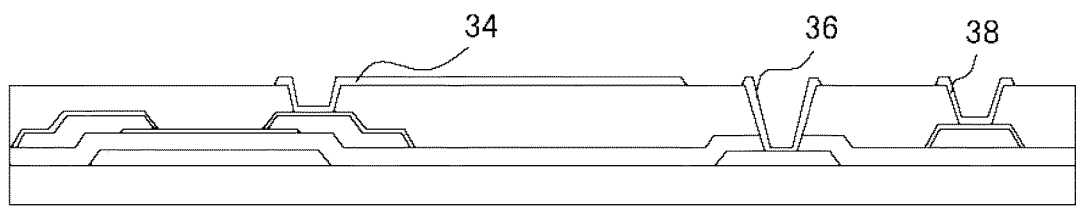
FIG. 8 illustrates a step of the method for fabricating an array substrate according to an embodiment of the invention.

Subsequently, a passivation layer 30 may be formed, and portions of the passivation layer 30 corresponding to the drain electrode, gate line and data line may be etched to form corresponding through-holes, for example, through-holes 32a, 32b and 32c respectively located at the positions corresponding to the drain electrode, gate line and data line, as shown in FIG. 7. In an embodiment, a via-hole of gate insulation layer may be formed at a position corresponding to the gate line in the gate insulation layer 18. As can be seen from FIG. 7, the through-hole 32b corresponding to gate line may pass through the passivation layer 30 and the gate insulation layer 18, thus directly exposing the gate line 16.

After planarization for the passivation layer 30, a transparent conductive thin film may be formed. A pattern including a pixel electrode 34, a connection line 36 for the gate line and a connection line 38 for the data line may be formed on the passivation layer with the through-holes may be formed through a patterning process, and the drain metal semiconductor compound layer 26b may be electrically connected to the pixel electrode 34 by means of the through-hole corresponding to the drain electrode.

With the method for fabricating an array substrate provided by the embodiments of the invention, by converting only the non-crystalline semiconductor thin film layer on the source electrode, drain electrode and data line into a metal semiconductor compound, the resulting metal semiconductor compound may prevent oxidative-corrosion of the surface of the metal thin film layer (e.g., a Cu or Ti layer) in the subsequent procedures. By means of such method, metal oxide thin film transistors may be fabricated, and also the oxidation of Cu or Ti at the source electrode or drain electrode can be prevented during the fabrication procedure of the thin film transistor using Cu or Ti.

According to a second aspect of the invention, an array substrate fabricated by using the above mentioned method for fabricating an array substrate is provided.

As to the array substrate fabricated by using the above mentioned method for fabricating an array substrate, only the non-crystalline semiconductor thin film layer on the source electrode, drain electrode and data line is converted into a metal semiconductor compound, in this way, the resulting metal semiconductor compound may prevent the oxidative-corrosion of the surface of the metal thin film layer, such as a Cu or Ti layer, in the subsequent procedures.

According to a third aspect of the invention, a display device comprising the above mentioned array substrate is provided.

Although the invention has been illustrated with reference to embodiments presently considered, it shall be understood that the invention is not limited to the disclosed embodiments. On the contrary, the invention is intended to cover various modifications and equivalent arrangements within the spirit and scope of the appended claims. The scope of the appended claims accords with the broadest explanations so as to include each modification as such as well as equivalent structures and functions.

The invention claimed is:

1. A method for fabricating an array substrate, comprising:
   forming a metal thin film pattern including a source electrode, a drain electrode and a data line;
   forming a non-crystalline semiconductor thin film layer on the metal thin film pattern; and
   performing annealing to convert only the non-crystalline semiconductor thin film layer on the source electrode, drain electrode and data line to a metal semiconductor compound and obtain a source metal semiconductor compound layer, a drain metal semiconductor compound layer and a metal semiconductor compound layer for the data line, such that each of the source electrode, the drain electrode and the data line is a double-layer structure, the double-layer structure comprising a lower metal thin film layer and a corresponding upper metal semiconductor compound layer,
   wherein the method further comprises removing the non-crystalline semiconductor thin film layer outside the regions of the source electrode, drain electrode and data line,
   wherein the non-crystalline semiconductor thin film layer comprises a layer of α-silicon, α-germanium, α-gallium arsenide, α-arsenic sulfide or α-selenium,
   wherein the metal semiconductor compound comprises a silicide of titanium, a germanide of titanium, a compound of titanium and α-gallium arsenide, a compound of titanium and α-arsenic sulfide, or a compound of titanium and α-selenium,
   wherein a temperature for the annealing ranges between 200° C. and 280° C.

2. The method according to claim 1, further comprising:
   prior to forming the metal thin film pattern including the source electrode, drain electrode and data line, forming on the substrate a gate, a gate line, a gate insulation layer covering the gate and the gate line, and an active layer arranged on the gate insulation layer and corresponding to the gate.

3. The method according to claim 2, wherein the step of forming a metal thin film pattern including a source electrode, a drain electrode and a data line comprises:
   forming a metal thin film layer; and
   removing the metal thin film layer outside regions of the source electrode, drain electrode and data line through a patterning process.

4. The method according to claim 3, wherein the metal thin film layer comprises a layer of copper or titanium.

5. The method according to claim 2, wherein the active layer is a metal oxide layer.

6. The method according to claim 5, wherein the metal oxide layer comprises an indium gallium zinc oxide, indium tin zinc oxide or nitrogen-doped zinc oxide semiconductor layer.

7. The method according to claim 1, further comprising:
   forming a passivation layer, and etching portions of the passivation layer corresponding to the drain electrode, gate line and data line to form corresponding through-holes.

8. The method according to claim 7, further comprising:
   forming a via-hole in the gate insulation layer at a position corresponding to the gate line on the gate insulation layer.

9. The method according to claim 8, further comprising:
   forming a transparent conductive thin film and forming a pattern including a pixel electrode, a connection line for the gate line and a connection line for the data line on the passivation layer with the through-holes through a patterning process, wherein the drain metal semiconductor compound layer is electrically connected to the pixel electrode by means of the through-hole corresponding to the drain electrode.

10. The method according to claim 8, wherein the metal thin film layer comprises a layer of copper or titanium.

11. The method according to claim 7, wherein the metal thin film layer comprises a layer of copper or titanium.

12. The method according to claim 1, wherein the metal thin film layer comprises a layer of copper or titanium.

13. The method according to claim 1, wherein the thickness of the non-crystalline semiconductor thin film layer is 10 Å-50 Å.

14. The method according to claim 1, wherein the annealing is performed under nitrogen atmosphere.

* * * * *